US006865726B1

(12) United States Patent
Igusa et al.

(10) Patent No.: US 6,865,726 B1
(45) Date of Patent: Mar. 8, 2005

(54) IC LAYOUT SYSTEM EMPLOYING A HIERARCHICAL DATABASE BY UPDATING CELL LIBRARY

(75) Inventors: Mitsuru Igusa, Los Gatos, CA (US); Wei-Lun Kao, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 10/117,761

(22) Filed: Apr. 3, 2002

Related U.S. Application Data

(63) Continuation-in-part of application No. 10/003,932, filed on Oct. 22, 2001, now Pat. No. 6,578,183, which is a continuation-in-part of application No. 10/003,595, filed on Oct. 30, 2001, now Pat. No. 6,651,235.

(51) Int. Cl.[7] .............................................. G06F 17/50
(52) U.S. Cl. ............................ 716/18; 700/97; 716/1; 716/3; 716/17
(58) Field of Search .......................... 700/97; 716/1, 716/3, 17, 18, 7, 2, 11, 12; 125/18; 703/23

(56) References Cited

U.S. PATENT DOCUMENTS

| | | | | |
|---|---|---|---|---|
| 726,902 A | * | 5/1903 | George et al. ................ | 125/18 |
| 5,036,473 A | * | 7/1991 | Butts et al. ................... | 703/23 |
| 5,831,869 A | | 11/1998 | Ellis et al. ...................... | 716/6 |
| 6,487,469 B1 | * | 11/2002 | Formenti ....................... | 700/97 |
| 2003/0079192 A1 | * | 4/2003 | Cheong et al. ................ | 716/7 |

* cited by examiner

Primary Examiner—Thuan Do
(74) Attorney, Agent, or Firm—Daniel J. Bedell; Smith-Hill and Bedell

(57) ABSTRACT

An IC layout system compiles a hierarchical netlist describing an IC into a database having a separate record for each cell and each module of the IC. Each database record references a cell library entry describing the cell or module and indicates a hierarchical relationship between its corresponding cell or module and other IC cells or modules. The system initially processes the database to reduce the number of cell and module records by combining hierarchically related cells and modules into larger cluster cells. The system then processes the database and cell library to generate a trial layout of the IC which positions highly interconnected cells near one another without regard to the hierarchical nature of the design. The system divides the IC design into separate partitions along hierarchical lines and then develops estimates of the size, shape and position of substrate area needed for each partition based on actual areas in the trial layout occupied by cells forming modules to be assigned to each partition. The system also allocates signal path timing constraints based on calculated path delays within the trial layout. The system thereafter processes the database and cell library to separately lay out each partition.

25 Claims, 7 Drawing Sheets

IC LAYOUT SYSTEM EMPLOYING A HIERARCHICAL DATABASE BY UPDATING CELL LIBRARY

CROSS-REFERENCE TO RELATED APPLICATIONS

The present application is a continuation-in-part of application Ser. No. 10/003,932 filed Oct. 22, 2001 now U.S. Pat. No. 6,578,183, incorporated herein by reference.

The present application is a continuation-in-part of application Ser. No. 10/003,595 filed Oct. 30, 2001 now U.S. Pat. No. 6,651,235, incorporated herein by reference.

BACKGROUND OF THE INVENTION

1. Field of the Invention

The present invention relates in general to a system for laying out an integrated circuit (IC) and in particular to an IC layout system employing a database describing the IC as a modular hierarchy of cells.

2. Description of Related Art

FIG. 1 is a data flow diagram illustrating various steps of a typical IC design process. An IC designer usually begins the IC design process by producing a register transfer language (RTL) netlist 10 describing the IC circuit as a set of circuits nodes ("nets") linked to terminals of logic devices described only in terms of the Boolean logic relating their input and output terminals. The designer then employs a circuit simulator and other tools 11 to verify the behavior of the circuit described by the netlist in response to a set of input signals. Since the RTL netlist models only circuit logic, simulation and verification at this point does not take into account signal path timing considerations. Having verified the logic of the circuit, the designer next uses a syntheses tool 12 to create a "gate level" netlist 14 modeling the circuit as a set of interconnected circuit components (cells), wherein each cell is described by an entry in a cell library 13. IC components described as library cells may range from individual transistors and small components such as logic gates incorporating several transistors up to very large components such as computer processors and memories. Each cell library entry includes a mathematical model of the cell describing its time-dependent behavior.

The gate level netlist 14 and the cell models included in the cell library enable circuit simulation and verification tools 11 to verify not only the circuit's logic but also its time-dependent behavior. However since the gate level netlist does not accurately model signal routing paths between the cells, simulation and verification tools 11 do not accurately account for those signal path delays.

An IC designer usually finds it convenient to create netlists 10 and 14 that are hierarchical in nature, grouping various cells into modules which may themselves be grouped into progressively higher level modules. For example a computer processor module may include many submodules such as registers, instruction decoders, cache memories and the like, which in turn may be formed by lower level modules or individual cells. RTL and gate level netlists for large IC designs can have many hierarchical levels.

FIG. 2 graphically illustrates a simple IC design including a top level module A formed by three lower level modules B–D. Module B in turn includes a set of low level "leaf" cells, E–H. Module C includes one submodule I and one cell J. Module D includes four cells K–N. Module I includes two cells O and P. While FIG. 2 depicts an IC formed by only 11 cells grouped into a three-level hierarchy of five modules, IC designs may include thousands or millions of cells grouped into a modular hierarchy having a great many levels; however the simple example of FIG. 2 is sufficient to illustrate a modular IC design.

Referring again to FIG. 1, a database compiler 18 processes gate level netlist 14 to produce a database 20 including a record corresponding to each cell of the IC. Each record references the cell library entry of its corresponding cell and indicates the circuit net to which the cell's terminals are to be connected. While a hierarchical IC design is easier for an engineer to comprehend than a "flat" design that does not organize cells into a hierarchy of modules, conventional placement and routing (P&R) tools that develop layouts of ICs described by netlists typically ignore the hierarchical nature of a design since the P&R tools normally place and route on a cell-by-cell basis. Hence when database compiler 18 processes a hierarchical gate level netlist 14 to produce a placement and routing database 20, database 20 includes only one record for each leaf cell to be included in the IC, and the database does not indicate the cells position in the modular hierarchy.

A typical database 20 will contain a separate record for each cell and a separate record for each terminal of each cell. Each cell record normally includes following fields:

Cell Name (Index field)
Library Reference
Location
First Terminal

The Cell Name field is a unique identifier for that cell and is used as a database index. The Library Reference field points to the cell library for that cell. The Location field indicates the position and orientation of the cell in the substrate. The Location field is left empty when the P&R tool is be free to place the cell anywhere it wants to. However in some cases a designer may want to force the P&R tool to place a cell (usually a big cell such as an embedded memory) in some particular area of a substrate. In such case the designer provides data base compiler 18 with placement constraint data indicating the desired position and orientation of the cell, and the compiler puts the appropriate position and orientation information into the Location field of the database entry for that cell.

Each cell will have one or more input/output terminals and each terminal of a cell will have its own record in database 20. The entries for all terminals of a cell form a linked list, and the data base entry for the cell includes a field (First Terminal) referencing the first entry of the linked list of entries for the cell's terminals.

The record for each terminal of a cell includes the following fields:

Terminal Name (Index field)
Cell Name
Library Terminal Reference
Net
Next Terminal The Terminal Name field is a unique name for the terminal and serves as the database index field. The Cell Name field points back to the database entry of the cell in which the terminal resides. The Library Terminal Reference field references the corresponding terminal of the prototype library cell. The Net field references an IC net (node) to which the terminal is to be connected. The Next Terminal field points to the terminal record for a next terminal (if any)

of the cells. The Next Terminal field thereby links all of the terminal records for the cell into a linked list. Thus after positioning a cell in the layout, a P&R tool can traverse the linked list of the cell's terminal entries to determine the circuit net to which each terminal is to be connected.

Referring again to FIG. 1, based on the information contained in database 20 and in cell library 13, an automated placement and routing (P&R) tool 22 generates an IC layout 24 attempting to satisfy various timing and spatial constraints the designer has imposed on the layout. As it generates layout 24, P&R tool 22 determines where each cell described in database 20 is to be placed in the substrate and designs the signal routing paths interconnecting them. After P&R tool 22 has generated a preliminary layout of the IC described by database 20, a clock tree synthesis (CTS) tool 23 designs one, or more clock trees (networks of buffered signal paths) for routing clock signals supplied as input to the IC to each clocked IC device such as a register or a flip-flop. P&R tool 22 adjusts the IC layout 24 to accommodate the buffered signal paths forming the clock tree(s) synthesized by CTS tool 23.

After P&R tool 22 has created an IC layout 24, a netlist compiler 26 converts the layout back into a "layout level" netlist 28 that accurately models the time-dependent behavior not only of the cells forming the IC described by gate level netlist 14, but also the routing structures that interconnect those cells and the buffers and signal paths forming the IC's clock tree. The designer may then again use circuit simulation and verification tools 11 to analyze the layout level netlist 18 to accurately verify that the IC described by layout level netlist 28 will behave correctly. The designer may iteratively repeat the IC placement and routing process as necessary to find a placement and routing solution satisfying all timing and other constraints.

Min-cut Placement and Routing

A typical P&R tool iteratively searches for an appropriate cell layout satisfying the IC's various spatial, timing and other constraints. Various placement algorithms such as the widely used "min-cut" algorithm, can reduce the time a P&R tool needs to find an acceptable cell placement. A min-cut algorithm progressively divides the substrate area into smaller and smaller partitions. After dividing each partition into sub-partitions, it allocates the cells to its sub-partitions in a manner that attempts to minimize the number of signal paths that must pass between sub-partitions to interconnect the cells. Keeping signal paths between cells short improves the chances that the P&R tool will be able to find space for routing paths between the cells and improves the chances that the IC layout will satisfy various timing constraints. A min-cut placement algorithm therefore tries to minimize signal path lengths by positioning highly interconnected cells near one another.

FIG. 3 illustrate the min-cut process. Although ICs typically have thousands or millions of cells, for simplicity the example of FIG. 3 assumes the IC design includes only 26 cells A–Z that are to be placed within a substrate area 14. The min-cut algorithm initially divides the substrate into two partitions 16 and 18 and to randomly assign cells A–Z to the two partitions, thereby creating an initial "seed partitioning" 20. The placement algorithm then tries to optimize the manner in which cells are allocated to the two partitions 16 and 18 by moving cells from partition-to-partition trying to find a placement that minimizes the number of cell-to-cell connections that cross between the two partitions. For large ICs it would take too long to try all possible placements, so in many systems each cell is moved only once from one partition to another, and then moved back if the move increases the number of signal paths between the partitions.

After attempting to optimize the placement of cells between the two initial partitions 16 and 18, the algorithm divides partition 16 into two smaller partitions 21 and 22 and divides partition 18 into two smaller partitions 23 and 24. The algorithm then again tries to minimize the number of signal paths crossing between partitions 21 and 22 by appropriately allocating cells of partition 16 among partitions 21 and 22. The system will also try to minimize the number of signal paths between partitions 23 and 24 by allocating cells of partition 18 between those two partitions. After optimizing the cell placement within partitions 21–24, the system further divides each partition 21–24 to produce a set of eight partitions 31–38 and repeats the optimization process. The partitioning process continues until the partition size reaches a lower limit.

FIG. 4 is a flow chart illustrating a processes carried out by a typical P&R tool making use of a min-cut algorithm for generating a cell placement in an IC substrate. Steps 40–43 of FIG. 3 depict the min-cut process illustrated in FIG. 4. The P&R tool establishes a seed partition at step 40, optimizes the partition at step 41, and then (step 42) determines whether the number of cells per partition has fallen below the predetermined lower limit. If not, the system partitions the substrate again (step 43) and repeats the optimization step 41. The tool iteratively repeats steps 41–43 until partitions reach their lower size limit at step 42.

After using the min-cut algorithm to place the cells, the P&R tool tries to lay out signal paths for interconnecting the cells (step 44). If the P&R tool is able to successfully lay out all necessary signal paths (step 45) based on the layout developed at steps 40–43, then the layout is analyzed (step 46) to determine whether it meets all timing and other constraints. When all constraints are satisfied (step 47), then at step 48 the clock tree synthesis tool designs a clock tree for the layout, the placement and routing-tool incorporates the clock tree into the layout (step 49), and the placement and routing process ends.

However if step 45 determines a successful routing plan could not be developed or step 47 determines the IC layout does not satisfy all timing and other constraints, then the process starts over again at step 40 by choosing another seed partition. Since the IC layout to be routed at step 44 is a direct result of the seed partition randomly selected at step 40, different seed partitions selected at step 40 are likely to result in a different IC placement and routing plans. Thus the P&R algorithm searches for an acceptable IC layout by randomly choosing a succession of seed partitions and testing whether each seed partition results in a placement that can be successfully routed and which meets various circuit timing and other constraints. While the min-cut algorithm randomly chooses seed partitions, the iterative partitioning and optimization process increases the likelihood that the randomly chosen seed partition will result in an acceptable layout. The min-cut approach will typically find a suitable layout more quickly than a system that randomly chooses placement plans to be routed. However the process can still be time-consuming, particularly when the IC includes a large number of cells.

Clustering

As ICs become progressively larger, P&R tools have needed more time to lay out ICs despite the increasing speed of computers implementing the P&R tools. "Clusteringt" helps to reduce processing time needed to lay out an IC. Since the amount of time a min-cut layout system requires to carry out the optimization process after each division increases with the number of cells in the design, redefining a group of highly interconnected cells as a single "cluster cell" reduces the number of cells to be placed during each iteration of the optimization process. The paper entitled "Multilevel Circuit Partitioning" by Alpert et. al. published in 1997 by the Design Automation Conference describes a clustering process in which small cells are organized into large clusters during early stages of a min-cut layout process when partitions are large to reduce the number of cells that have to be moved from partition-to-partition when optimizing cell placement. The number of cells per cluster is progressively reduced as the partitions become smaller.

Partitioning

Another way a designer can reduce the time required to lay out an IC is to divide the circuit design into two or more partitions and to separately lay out each partition. (Note that in this context the word "partition" applies to a portion of the IC design, whereas in the context of the above-described min-cut placement process, the word "partition" applies to a portion of the substrate area in which cells of an IC are placed.) Since the time a min-cut placement algorithm needs to lay out an IC increases geometrically with the number of cells forming the IC, it can be much faster for a P&R tool to successively lay out M partitions of an IC having an average of N cells each than to lay out an entire IC having M*N cells. Further speed improvements can be had by using separate P&R tools to concurrently lay out the partitions. It can be helpful to partition a hierarchical design along modular lines since cells belonging to the same module tend to be highly interconnected with one another. Also, when modules of an IC design are placed in identifiable areas of a semiconductor substrate it is possible to later modify the layout of one module of an IC without having to extensively redo the layout, for the entire IC.

When partitioning an IC design, a designer typically creates a floor plan of the semiconductor substrate in which the IC is to be formed. The floor plan reserves an area of the substrate for each partition to hold the cells to be placed within each partition and positions and orients the partitions within the substrate. The designer also creates a "pin assignment" plan indicating where signal paths that interconnect the partitions are to cross the boundaries between the partitions. The floor and pin assignment plans act as constraints on the placement and routing of each partition. However the designer may have difficulty producing appropriate floor and pin assignment plans because it is often hard for a designer to accurately estimate an appropriate size, shape and position of the substrate area allocated to each partition and hard for the designer to determine where signal paths ought to cross partition lines.

In addition to creating floor and pin assignment plans, the designer must also determine how to partition the IC's timing constraints. A timing constraint typically specifies that a signal path formed by a set of cells connected between two circuit nodes A and B may have a signal path delay no greater than some maximum limit. A P&R tool tries to lay out the IC so that it satisfies all such timing constraints. However when the designer partitions the design in such a way that node A appears in one partition and node B appears in another partition, then the designer must also divide the timing constraint among the partitions by allocating a separate portion of the maximum allowable signal path delay to the portion of the signal path residing in each partition. It can be difficult and time consuming for the designer to determine how much of that maximum signal path delay to allocate to each partition.

What is needed is a placement and routing system that automatically partitions an IC and then separately generates the if layout for each partition. Accordingly such a P&R system must be able to automatically create appropriate floor and pin assignment plans based on the description of the IC included in the P&R database it receives as input.

BRIEF SUMMARY OF THE INVENTION

The invention relates to computer-readable media storing program instructions for a computer which when executed by the computer causes the computer to carry out a method for processing a gate level netlist to produce a layout of an integrated circuit (IC). The gate level netlist describes the integrated circuit (IC) by identifying the cells to be included in the IC, by identifying all of the nets of the IC, and by indicating the particular net to which each terminal of each cell is to be interconnected. The netlist identifies each cell by pointing to an entry in a cell library describing the structure of the cell. A hierarchical netlist organizes the cells into a hierarchies of modules, with modules at each level of the hierarchy being formed by modules and/or cells at a next lower level of the hierarchy.

In accordance with the invention, the computer generates a cell library entry for each module of the design so that each module may be treated as a cell. The computer then converts the netlist into a placement and routing (P&R) database including a separate record for each cell, module and terminal of each module or cell. The database record for each cell or module record includes the following fields:

Name (Index field)
Library Reference
Location
Parent
Next Sibling
First Child
First Terminal The Name field is a unique identifier for that cell or module and is used as a database index. The Library Reference field points to the cell library entry for that cell or module. The Location field indicates a predetermined position and orientation (if any) of the cell or module when the IC is laid out in a semiconductor substrate. The Parent field points to the database record of the parent module (if any) of the cell or module within the design hierarchy. The Next Sibling field creates a linked list of entries for all children having the same parent module by pointing to a next sibling cell or module having the same parent. The First Child field of a parent module record points to the database record of the first child of its linked list of entries of its child modules and cells.

Each cell or module will have one or more input/output terminals, and each terminal will have its own record in the database and the entries for all of the terminals of a cell form a linked list. The data base record for each cell or module includes a First Terminal referencing the first record of the linked list of database records for its terminals.

The database record for each terminal of a cell or module includes the following fields:

Name (Index field)
Library Reference
Parent
Next Sibling
Net

The Name field is a unique name for the terminal and serves as the database index field. The Library Reference field references the corresponding terminal within a cell library entry. The Parent field references the database entry of the cell containing the terminal. The Next Sibling field references the database entry for a next terminal of the linked list of the parent cell's terminals. The Net field references the circuit net to which the terminal is to be connected. The P&R database thus preserves the hierarchical nature of the design included in the netlist. An IC layout system in accordance with the invention uses the information contained in the hierarchical database to automatically develop floor and pin assignment plans that partition in the IC design along modular lines. Each partition is then separately placed and routed.

It is accordingly an object of the invention to provide a system for automatically partitioning an IC design along modular lines and for separately laying out each partition.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

BRIEF DESCRIPTION OF THE DRAWING(S)

Figure 1:
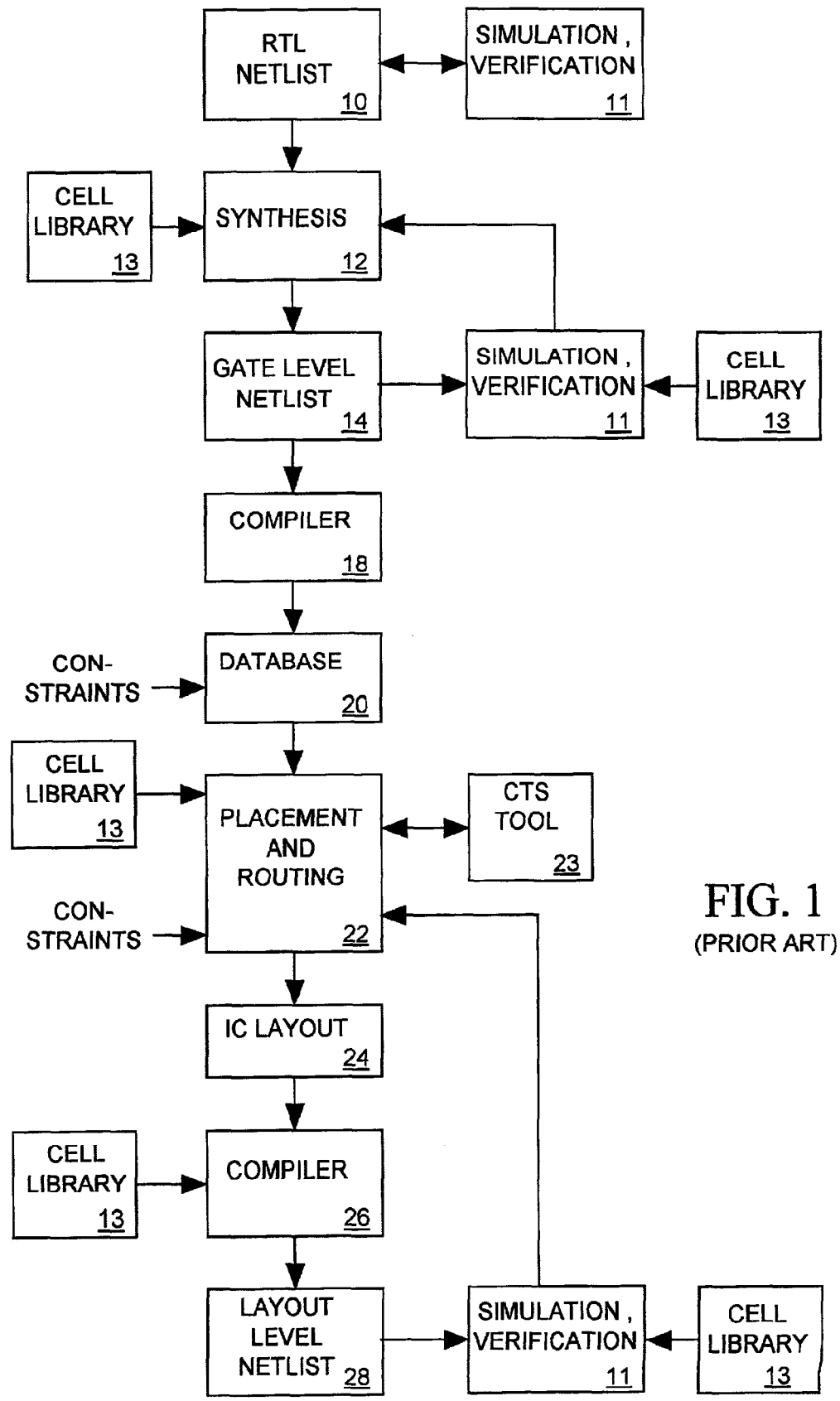
FIG. 1 is a data flow diagram illustrating a prior art integrated circuit (IC) design process.
Figure 4:
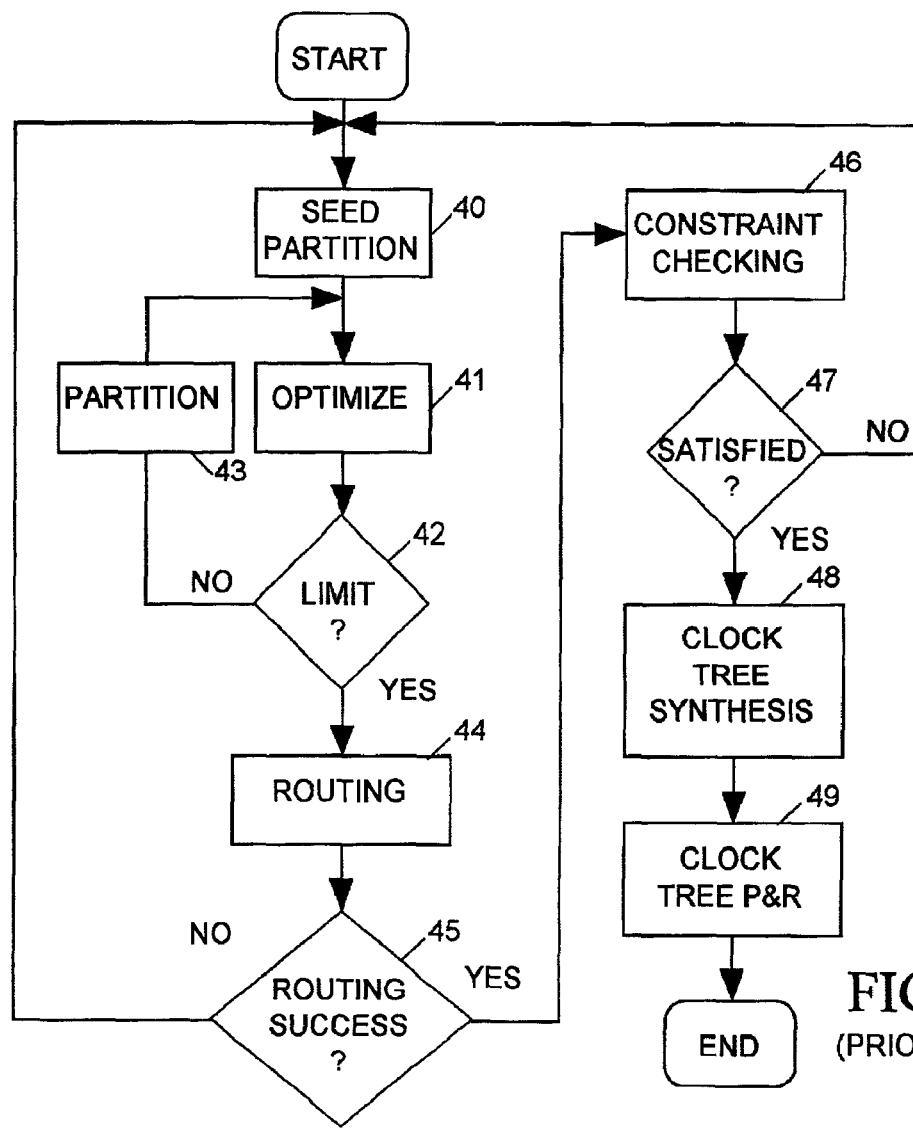
Figure 3:
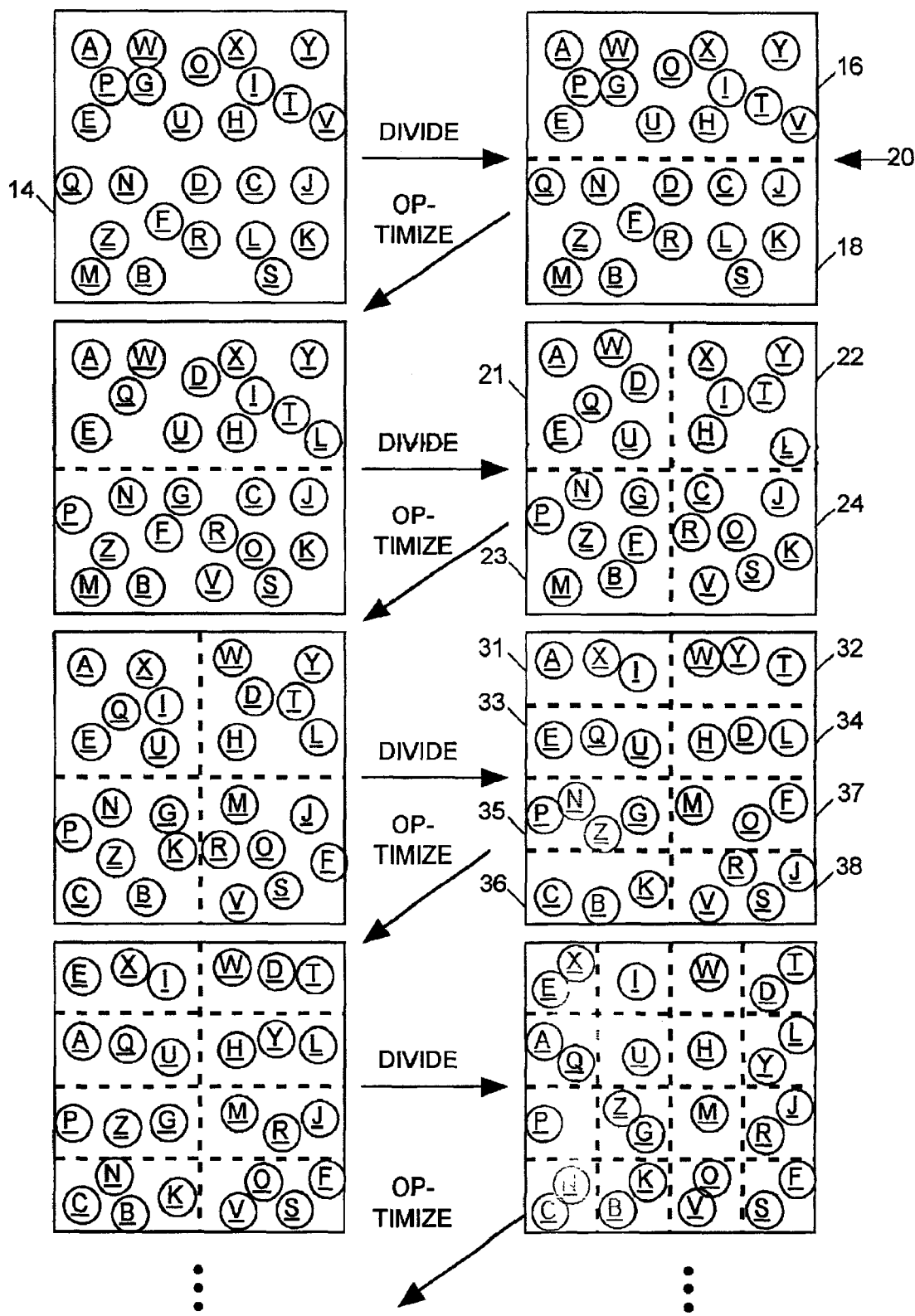
FIG. 3 is a pictorial illustration of a prior art "min-cut" process.
Figure 5:
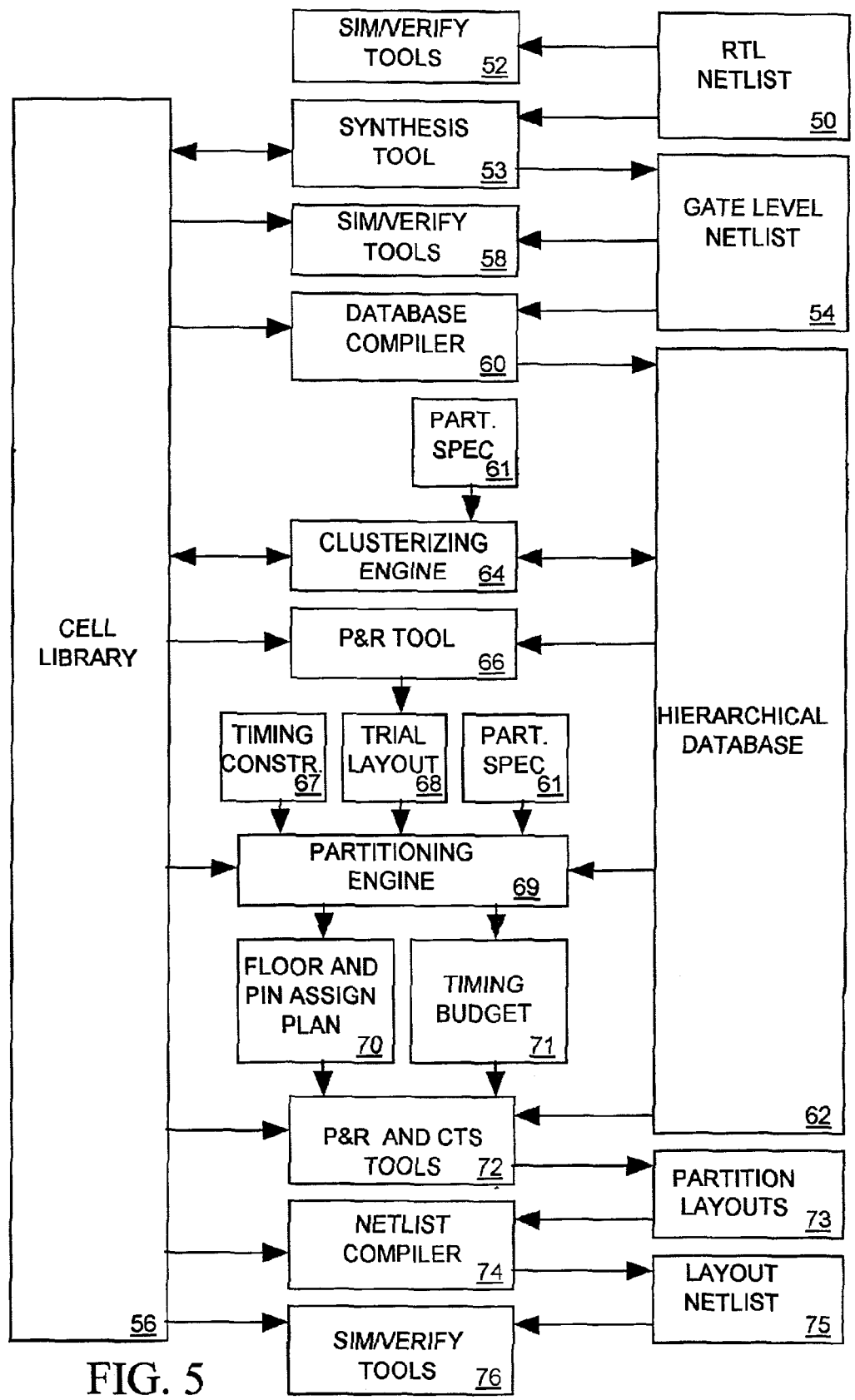
Figure 6:
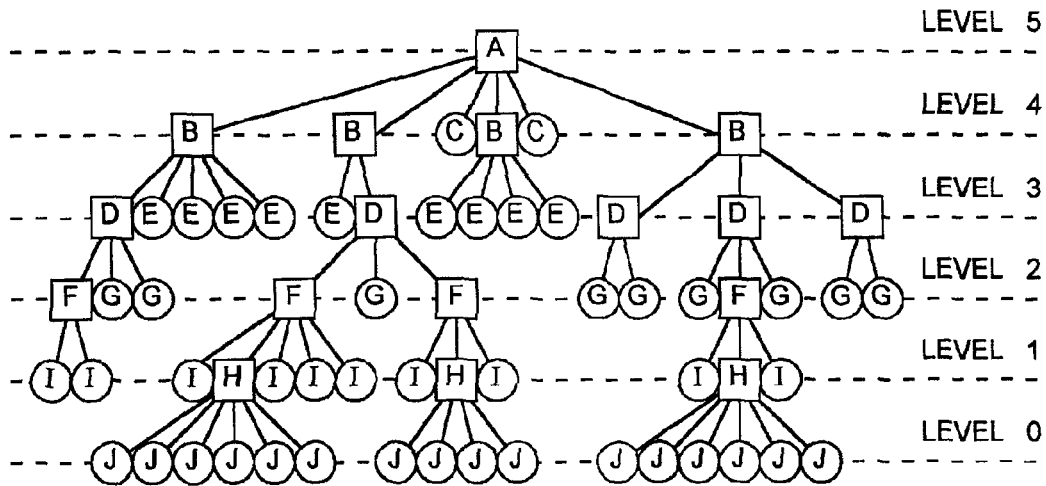
Figure 7:
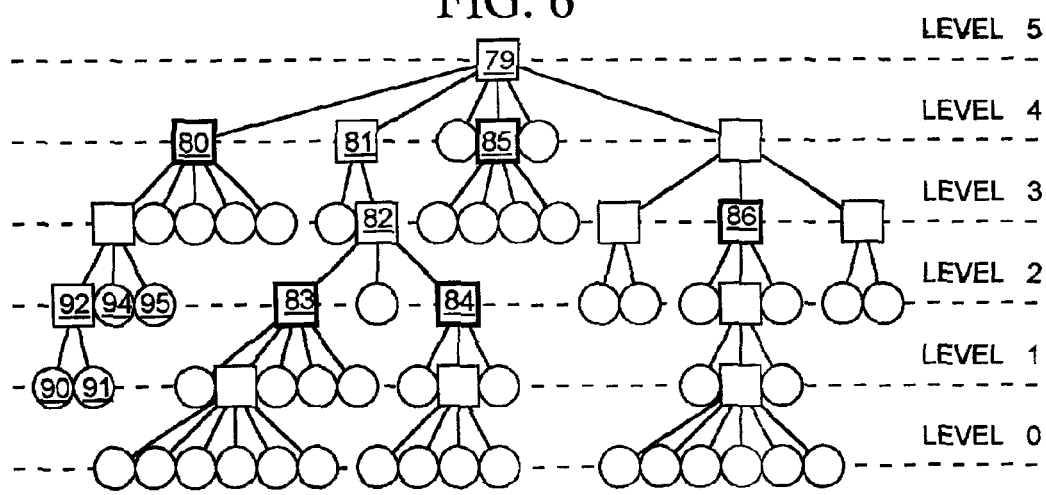
Figure 8:
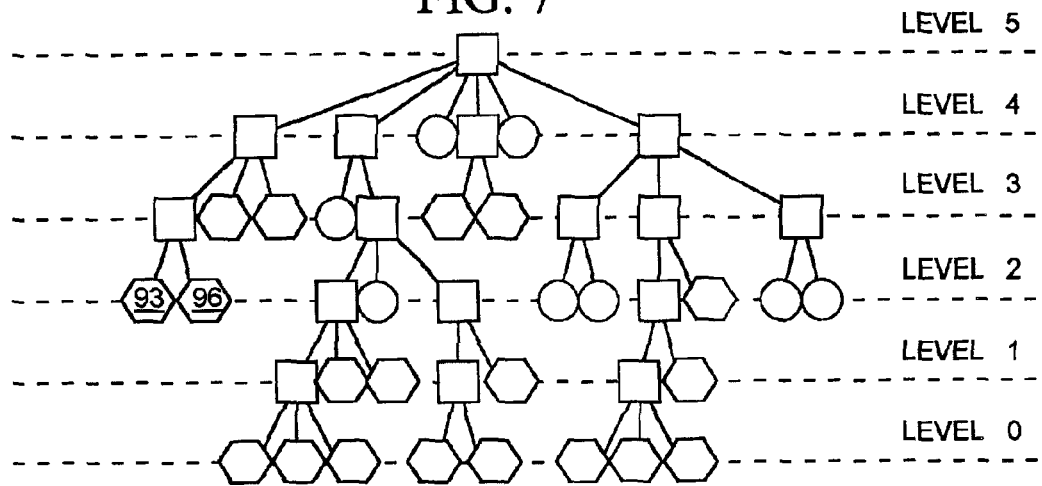
Figure 9:
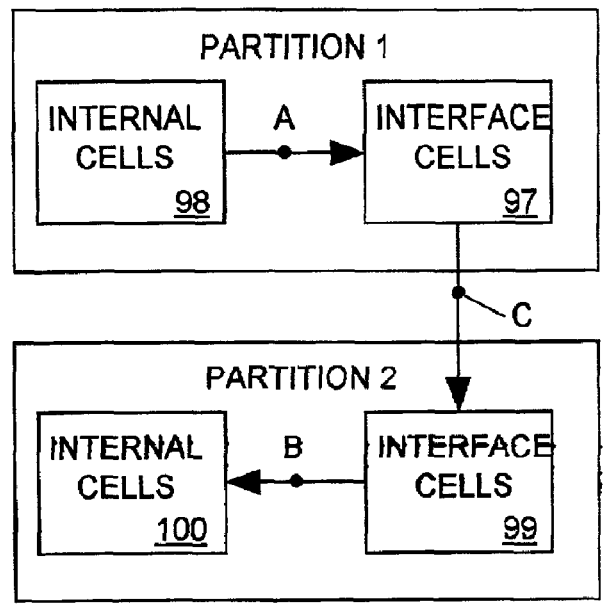
Figure 13:
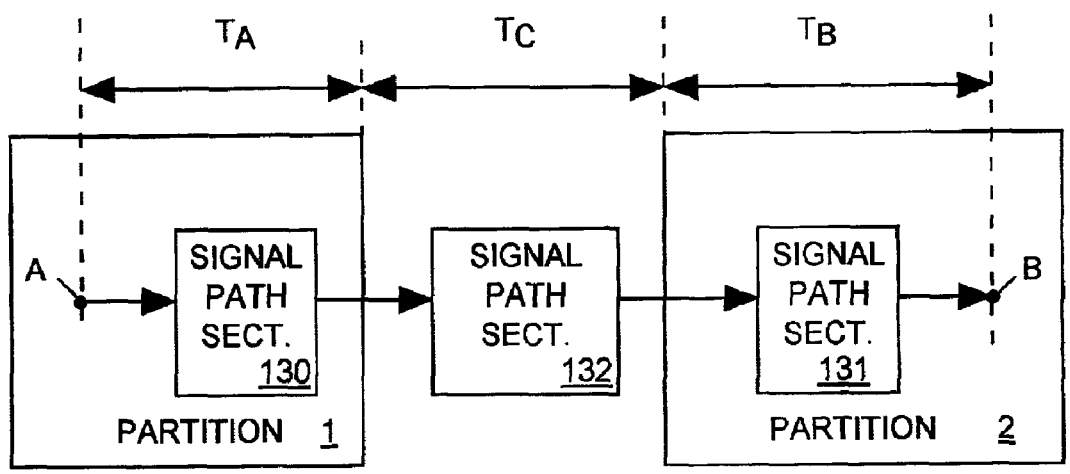
Figure 10:
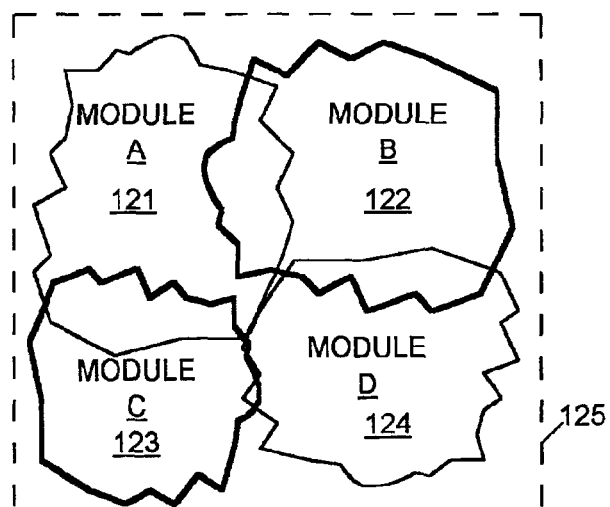
Figure 11:
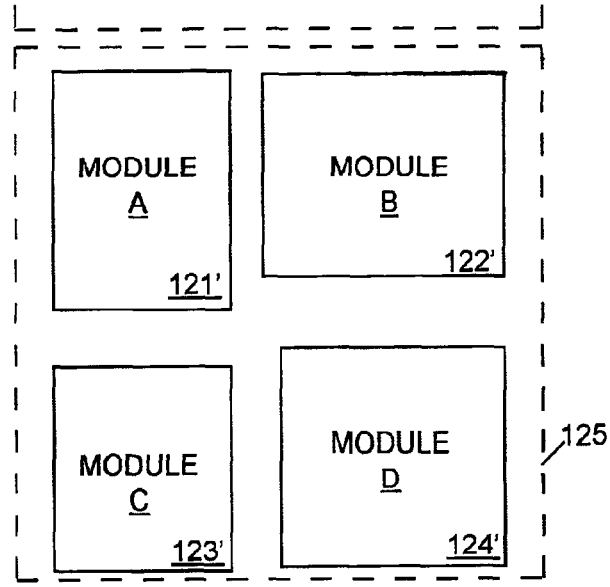
Figure 12:
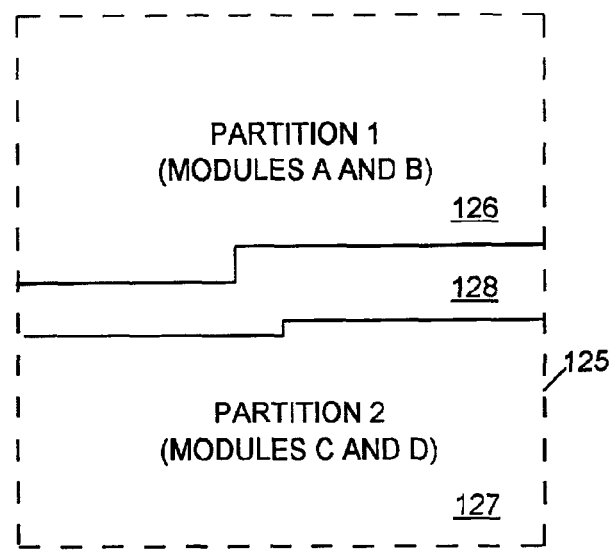

FIG. 4 is a flow chart illustrating the prior art placement and routing tool of FIG. 1 in more detail, FIG. 5 is a data flow diagram illustrating an IC layout process in accordance with the invention, FIGS. 6–8 are pictorial illustrations of a hierarchical clustering process employed by the IC clustering engine of FIG. 5, FIG. 9 is a block diagram illustrating two interconnected partitions of an example IC design, FIGS. 10–12 pictorially illustrate a floor planning process carried out by the partitioning engine of FIG. 5, and FIG. 13 is a block diagram illustrating two interconnected partitions of an example IC design.

DETAILED DESCRIPTION OF THE INVENTION

The present invention relates to computer software encoded onto computer readable media such as (but not limited to) one or more compact, hard or floppy disks, random access or read only memory) for programming one or more computers to generate a layout for an integrated-circuit (IC) based on a netlist description of the IC. The specification herein below describes an exemplary embodiment of the invention considered by the applicants to be the best mode of practicing the invention.

Layout Process Flow

FIG. 5 illustrates steps in a design process in accordance with the invention. An IC designer produces an IC design in the form of a register transfer language (RTL) netlist 50 describing the IC circuit as a set of circuit nets linking terminals of logic devices described only in terms of the Boolean logic relating their input and output terminals. The designer employs simulation and/or other verification tools 52 to verify the logic of the IC design described by RTL netlist 50 and may iteratively modify the RTL netlist until tools 52 verify the circuit logic it describes is correct. The designer then employs synthesis tools 53 to convert the RTL netlist 50 into a gate level netlist 54 describing each cell forming the IC by referring to an entry of a cell library 56 including detailed physical and behavioral model of IC gates forming the cell. The designer uses simulation and verification tools 58 to verify that an IC described by gate level netlist 54 will behave as expected and may iteratively modify gate level netlist 54 until tools 58 verify that the IC it describes will behave correctly.

Figure 2:
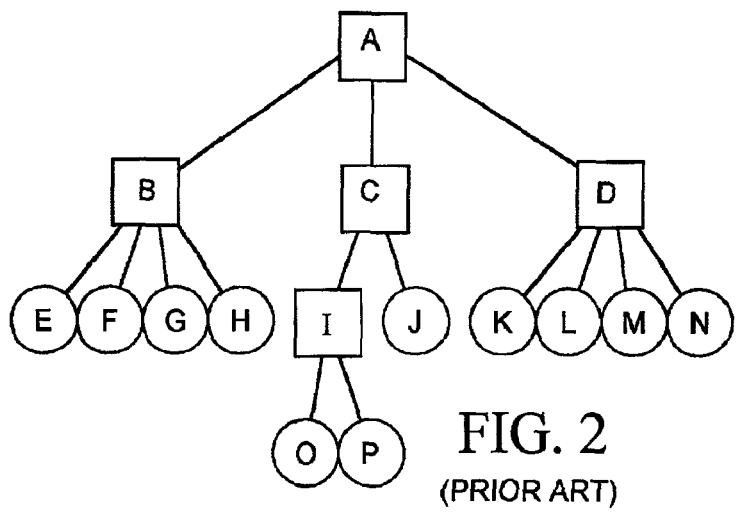
FIG. 2 is a graph of an example prior art hierarchical IC design.

Gate level netlist 54 organizes the cells forming the IC into a hierarchy of modules. For example FIG. 2 illustrates a hierarchical design in which modules are represented by squares and cells are represented by circles. In the example of FIG. 2, a single top level module A formed by three lower level modules B, C and D. A set of four cells D–H form module C, one module I and one cell J form module C, and four cells K–N form module D. Two cells form module I. A module formed by other modules or cells as a next lower level of the hierarchy is referred to as a "parent", the cells and modules that form it are its "children" and are "siblings" of one another. For example module A is the parent of the three sibling children, modules B–D. Module C is the parent of two sibling children, module I and cell J. Module I is the parent of two sibling children, cells O and P. While FIG. 2 illustrates an IC design as having only a 11 cells organized into a three-level module hierarchy, a typical IC design can have thousands or millions of cells organized into many hierarchical levels. In addition to creating gate level netlist 54, synthesis tool 53 also creates an entry in cell library 56 for each module of the design.

After the designer has produced a gate level netlist 54, a database compiler 60 converts that netlist into a hierarchical database 62 that retains information about the hierarchical nature of the design. Hierarchical database 62 includes one record for each cell and each module, and a separate record for each terminal of each cell and each module. Each cell or module record includes the following fields:

Name (Index field)
Library Reference
Location
Parent
First Child
Next Sibling
First Terminal The Name field is a unique identifier for that cell or module and is used as a database index. The Library Reference field points to an entry in a cell library describing that cell or module. The Location field indicates a preferred position and orientation (if any) of the cell or module when the IC is laid out in a semiconductor substrate. This field is normally left blank except when the designer wants the system to place the cell or module in a particular location of the substrate.

The Parent field points to the database record of the parent module (if any) of the cell or module within the design hierarchy. For example the Parent field of the database record for module B of FIG. 2 would point to the entry of its parent module A. The Parent field of the database record for cell C of FIG. 2 would point to the entry for its parent module B. The parent field for module A would be empty since module A has no parent.

The First Child field of a parent module record points to the database record of a first child of a linked list of entries of its child modules and cells. Thus the First Child field of Module A of FIG. 2 would point to the entry for module B and the First Child field of module B would point to the entry for cell E.

The Next Sibling field points a next sibling cell or module having the same parent. For example, the Next Sibling field of the entry for module B of FIG. 2 would point to module C, and the Next Sibling field of the entry for module C would point to the entry for module D. The Next Sibling field for module D would be null (no pointer). Similarly, the Next Sibling field for cells E, F and G would point to the entries for cells F, G and H, respectively, and the Next Sibling field for cell H would be null.

Each cell or module has one or more input/output terminals, and the database will includes a separate record for each cell or module terminal. The records for all of the terminals of a cell form a linked list, and the data base record for each cell or module includes a First Terminal field referencing the first record of the linked list of database records for its terminals.

The record for each terminal of a cell or module includes the following fields:

Name (Index field)

Library Reference

Parent

Next Sibling

Net

The Name field is a unique name for the terminal and serves as the database index field. The Library Reference field references the corresponding terminal within a cell library entry. The Parent field references the database entry of the terminal's parent cell (the cell containing the terminal). The Next Sibling field references the database entry for a next terminal of the linked list of the parent cell's terminals. The Net field references the circuit net to which the terminal is to be connected.

The amount of time a P&R tool needs to lay out an IC increases rapidly with the number of cells forming the IC but is independent of the size of each cell. To reduce the amount of time needed to layout the IC, a "clusterizing engine" 64 combines selected groups of cells to form larger "cluster" cells. Combining highly interconnected cells into the same cluster typically has only a modest effect on cell placement and routing because a P&R tool is likely to place highly interconnected cells near one another even when they are not combined into the same cluster cell. Therefore, as described in more detail below, clusterizing engine 64 processes hierarchical database 62 to determine which cells are siblings forming the same parent module and then groups sibling cells into cluster cells. It also updates hierarchical database 62 and cell library 56 to include entries describing the new cluster cells.

Normally a P&R tool can separately lay out several partitions of an IC design more quickly that in can lay out the entire IC at once. To do so it has been necessary for the designer to initially carry out the following activities:

1. determine which portion of the IC design is to be included in each partition, 2. create a floor plan for the IC layout allocating to each partition a separate area of the semiconductor substrate in which the IC is to be formed, 3. create a pin assignment plan indicating the points along partition area boundaries at which each partition's input and output signals are to cross, and 4. create a timing budget allocating timing constraint for any signal path within the IC among the partitions through which the signal path extends.

Although partitioning an IC design can speed the layout process, designers don't often try to partition their designs. It is hard for a designer to produce a suitable floor plan because it is hard for a designer to accurately estimate how much semiconductor area to allocate to each partition, what shape each area ought to be or how to best position the partitions relative to one another. A pin assignment plan is needed to ensure that signal paths between partitions will properly align when the partitions are separately laid out, but the designer often finds it difficult to determine where signals ought to cross partition boundaries. A designer places timing constraints on various signal paths within an IC to ensure signals will traverse those paths with specified maximum path delays. When a P&R tool lays out an IC, it tries to lay out each signal path for which there is a timing constraint so that its path delay is within the timing constraint. When a design is partitioned such that a signal path extends through more than one partition, the designer provides a timing budget allocating a separate portion of each timing constraint for each signal path to the portion of that signal path that resides within each partition. Designers usually find it hard to create timing budgets because it is hard to estimate which portion of a signal path's timing constraint ought to be allocated to each portion of that signal path before details of the signal path's layout are known.

The layout system of the present invention resolves the designer's partitioning problems by automatically developing the floor plan, pin assignment plan and timing budget base on a full-chip trial layout 68 generated by a P&R tool 66. P&R tool 66 is a conventional P&R tool employing a min-cut algorithm that tends to cluster highly interconnected cells near one another. Given enough time, P&R tool 66 could place every cell of the IC and route connections between the cells in a way that satisfies all design constraints. However P&R tool 66 is allowed only the relatively small amount of time it needs to find a placement that groups highly interconnected cells near one another and it is not allowed enough time to develop a detailed routing plan satisfying all timing constraints.

After P&R tool 66 generates trial layout 68, a partitioning engine 69 uses trial layout 68 as a guide for automatically partitioning the IC design so that each partition can be separately laid out. The designer supplies a partition specification 61 telling partitioning engine 69 which modules are to be included in each partition and supplies it with timing constraints for each signal path, and the partitioning engine then generates a suitable floor and pin assignment plan 70 and a timing budget 71 that is consistent with partition specification 61.

When generating the floor plan, partitioning engine processes database 62 to determine how cells are organized into modules and then processes trial layout 68 to determine where the cells of each module have been placed. The trial layout 68 is a "flat" layout in the sense that P&R tool 66 places each cell without regard to its parent/child/sibling relationships with other cells in the IC's modular hierarchy. Thus cells forming different modules may be intermingled in the trial layout 68. However since the sibling cells and modules forming a given parent module tend to be highly interconnected with one another, and since P&R tool 66 employs a min-cut algorithm that is biased towards placing highly interconnected cells near one another, sibling cells tend to cluster together in the trial layout 58. By determining where each child cell of a module was placed in trial layout 68, partitioning engine 69 can make an accurate estimate of the shape, relative size, and position of the area needed to accommodate the module and can therefore make a relatively accurate floor plan for a design partitioned along modular lines. Partitioning engine 69 is able to prepare a reasonably accurate pin assignment plan based on the position of signal paths within the trial layout that are to cross partition boundaries in the partitioned layout. Partitioning engine 69 also bases the timing budget allocation of the timing. constraint for each section of a signal path based on the relative delay it calculates for that section of the signal path as it appears in the trial layout.

After partitioning engine 69 has generated the floor plan, pin assignment plan 70 and timing budget 71, P&R and clock tree synthesis (CTS) tools 72 separately generate layouts 73 for each partition in the area allocated to that partition by the floor plan and in a manner that satisfies the pin assignment plan and timing budget. When generating the layout for each partition, P&R and CTS tools 72 consult hierarchical database 62 to determine which cells form the modules assigned to the partition and consults cell library 56 to determine the internal layout of each cell.

A netlist compiler 74 processes partition layouts 73 to produce a layout netlist 75 which describes the IC in more detail than gate level netlist 54 by including models of the signal paths between cells accurately depicting signal path delays. Simulation and verification tools 76 then verify that the IC described by the layout netlist 75 will behave correctly.

Clusterizing

FIG. 6 illustrates how an example gate level netlist 54 might organize a portion of a circuit formed by 46 cells (represented by small circles) into hierarchy of 17 logic modules (represented by small squares). As seen in FIG. 6 a single module A at the highest level of the hierarchy (level 5) is a parent of a set of six level 4 sibling modules B and cells C. A set of five modules D and nine individual cells E at level 3 are the children of models B of level 4. Four of modules F and nine cells G at level 2 are the children of models D. Three models H and ten cells I at level 1 are the children of the level 2 modules F. Level 1 modules H have sixteen children cells J residing at the lowest hierarchical level 0.

FIGS. 7 and 8 illustrates how clusterizing engine 64 of FIG. 5 organizes cells of the design hierarchy of FIG. 6 into clusters. The first step of the clustering process is to identify the highest level modules having N of cells lying within a user-selected range. Clusterizing engine 64 groups cells of those modules into clusters. In this simple example the range of N is selected to be from 6 to 10, though in practice where modules are much larger, the lower and upper limits of the range are suitably much larger. Thus in this example clusterizing engine 64 looks for the highest level modules incorporating from 6 to 10 cells. To do so, clusterizing engine 64 initially traverses the modular hierarchy starting with the module 79 at the highest level (level 5) of the hierarchy. Since module 79 includes more than ten cells, it is not selected as a "clusterable" module. Clusterizing engine 64 therefore looks at all of the modules on the next lower level of the hierarchy (level 4) which are included within module 79, starting with module 80. Since clusterizing engine 64 finds that module 80 includes a total of eight cells residing on levels 1–3 it identifies module 80 as a "clusterable" module. Clusterizing engine 64 then looks at the next module 81 of level 4 and finds that it includes more than 10 cells and therefore does not select module 81 as a clusterable module. Instead clusterizing engine 64 looks at module 82 on level 3 to determine whether it includes from 6 to 10 cells. Since it also has more than 10 cells, clusterizing engine 64 checks the modules 83 and 84 forming module 82 and finds that the number of cells with each of those modules is within the range 6 to 10. Clusterizing engine 64 therefore chooses both modules 83 and 84 as clusterable modules. As clusterizing engine 64 continues to traverse the hierarchy in a similar manner it finds modules 80, and 83–86 to be clusterable modules. (FIG. 7 depicts "clusterable" modules using boxes having thick borders.)

Clusterizing engine 64 next decides how many cells to include in each cluster. To do so clusterizing engine 64 first chooses a target total number M of cells to be included in the design after clustering. Making M small speeds up the layout process, but it also reduces the flexibility clusterizing engine 64 has in finding an layout satisfying all placement and routing criteria. For large ICs including more than a million cells, a value of M of about 300,000 typically produces good results. However in the simplified example herein, where the IC includes only 46 cells, we choose M to be 30.

Next clusterizing engine 64 counts the number P of cells outside clusterable modules and the number Q of cells inside cluster modules. In the example, P=8 and Q=38. Given the values of P, and M, clusterizing engine 64 calculates a "cluster ratio" as follows:

$$R=RND[Q/(M-P)]$$

where RND[ ] is a rounding function that rounds its argument to the nearest integer. The cluster ratio R indicates a target number of cells that are to be included in each cluster. In this example $$R=RND(38/(30-8)]=2.$$

Hence clusterizing engine 64 will try to form clusters having two cells each from the cells forming each clusterable module. In practice, however, R will be a larger number, for example 5–10, and the clusterizing engine will try to make clusters having 10 cells each, although it may form some clusters having slightly more or slightly less than 10 cells when the number of cells within a clusterable module is not an even multiple of 10. Thus the clustering process reduces the number of cells in the design to approximately M by grouping cells into clusters all of which include approximately the same number (R) of cells.

FIG. 8 illustrates the result of the clustering process in which small hexagons represent cell clusters. Note for example that module 92 of FIG. 7, which included two cells 90 and 91, was converted into a single cluster 93 as shown in FIG. 8. Cells 94 and 95 of FIG. 7 are grouped into a single cluster 96 of FIG. 8. Thus whereas the non-clustered design of FIG. 7 includes 46 cells, the clustered design of FIG. 8 includes 19 clusters and 8 non-clustered cells for a total of 27 "cells" that must be placed and routed—close to the target number M=30.

The designer provides clusterizing engine 64 with the partition specification 61 (FIG. 5) indicating how many partitions of the IC design are to be separately laid out and indicating which modules of the design are to be included in each partition. When initially clustering the design, clusterizing engine 64 avoids creating clusters that cut across partition lines. This normally does not pose much of a restriction on clustering since clustering normally occurs at lower levels of the design hierarchy while partitioning normally occurs at higher levels of the design hierarchy. However the partition specification 61 also places a more subtle restriction on clustering that is related to timing constraints.

FIG. 9 illustrates two partitions 1 and 2 connected by a signal path linked to a node C in an area of the substrate external to both partitions. Partition 1 includes a set of "interface" cells 97 forming a signal path between a node A within partition 1 and a node C between partitions 1 and 2. All other cells of partition 1 are classified as "internal" cells 98. Similarly partition 2 includes a set of "interface" cells 99 forming a signal path between a node B within partition 2 and node, C. All other cells of partition 2 are classified as "internal" cells 100. The designer has placed a timing constraint on the signal path between nodes A and B; a signal must be able to traverse that path within some maximum allowable time specified by the timing constraint. Thus it is necessary for P&R and CTS tools 72 (FIG. 5) to place the interface cells 97 and 99 forming the path between nodes A and B so as to satisfy the timing constraint. To provide P&R and CTS tools 72 with maximum flexibility during the layout process to position interface cells so as to meet a timing constraint, clusterizing engine 64 refrains from clusterizing interface cells prior to carrying out the layout process. In that regard, the clusterizing engine 64 treats as an interface cell any cell within any time constrained signal path between two partitions.

Floor and Pin Assignment Plans

Partitioning Engine 69 partitions the design along modular lines as specified by partition specification 61 provided by the user so that each partition can be independently placed in a separate, identifiable area of the substrate. To do so the partitioning engine 69 estimates the size, shape and position of the area needed for each partition and then separately performs placement and routing for each partition. Doing so provides two advantages. First, it can help to speed up the layout process by reducing a big IC layout to several small ones. The time P&R 72 needs to find an acceptable placement and routing solution is a geometric function of the number of cells to be placed and routed. Hence when the IC design is divided into several partitions, with each partition being separately placed and routed, the total processing time P&R and CTS tools 72 need to separately place and route all partitions is typically much less than the processing time it would need to place and route an entire unpartitioned design. Further speed improvements can be had when more than one P&R tool running on separate computers are used to concurrently place and route each partition.

The second advantage to partitioning becomes apparent when a designer makes small changes to an IC design for which an IC layout has already been produced. This happens, for example, when small portions of an IC design must be occasionally modified to customize the IC for particular applications. When the layout has been performed on an unpartitioned design, cells of various modules are intermingled to some extent in the substrate, and any change to the design makes it necessary to completely redo the layout for the entire IC. However when modules are placed in separate areas of the substrate with the cells forming those modules being independently placed and routed, it is possible to modify the design of one module without having to redo the layout for the entire IC; only the layout for the partition containing the changed module need be redone.

Thus after clusterizing engine 64 modifies cell library 56 and database 62 to reduce the number of cells in the design, and after P&R tool 68 produces trial layout 68 establishing a preliminary position for each cells in the IC substrate, partitioning engine 69 uses the trial layout as a guide for developing an IC floor and pin assignment plan 70. The floor plan allocates an area of substrate space to each partition defined by partition specification 61 and the pin assignment plan specifies points along the boundaries of each partition at which inter-partition signal paths terminate partitioning engine 69 accesses database 62 to determine which cells are included in each partition.

FIG. 10 illustrates a simple example of a trial layout within a substrate 125 of four modules A–D at a level of a design hierarchy at which the design is to be divided into two partitions. The partition specification calls for modules A and B to be included in one partition and for modules C and D to be included in the other partition. Since cells forming a module tend to be highly interconnected, they tend to cluster together in the trial layout. However the areas 121–124 occupied by cells forming the four modules A–D, respectively, tend to be somewhat amorphous in shape and they overlap with one another to some extent. Partitioning engine 69 can nonetheless make a reasonably good estimate of size and shape of more regular areas of the substrate that can accommodate the module based on the relative size and shape of the area occupied by each module in the trial layout. For example based on the trial layout of FIG. 10 partitioning engine 69 would determine that the four rectangular areas 121'–124' of substrate 125 as illustrated in FIG. 11 would likely be sufficient to hold all of the cells of a corresponding one of the four modules. Partitioning engine 69 chooses the shapes and positions of areas 121'–124' so that they have approximately the same centroids and aspect ratios as those of corresponding areas 121–124 of FIG. 10, but in addition to making areas 121'–124' more rectilinear in shape than areas 121–124, partitioning engine 69 also ,makes areas 121'–124' proportionately smaller than corresponding areas 121–124 so that areas 121'–124' do not overlap one another.

Partitioning engine 69 next groups the modules corresponding to areas 121' and 122' into one partition and groups modules corresponding to areas 123' and 124' into the other partition. Partitioning engine 69 then produces a floor plan as illustrated in FIG. 12, which reserves an area 126 for cells forming the partition to include modules A and B and reserves an area 127 for cells forming the partition to include modules C and D. Areas 128 of substrate 125 not included in partition areas 126 and 127 are reserved for signal routing paths between the partitions and for individual cells at the level of the hierarchy of modules A–D that are not included in any of modules A–D.

Partitioning engine 69 also develops a pin assignment plan indicating where signals passing between partitions 1 and 2 are to cross the boundaries of areas 126 and 127. The crossing points of those signals are positioned as near as possible to the positions within the trial layout of FIG. 10 of cells that terminate those signals.

Timing Budget

In addition to developing a gate level netlist describing the IC, the IC designer also establishes a set of timing constraints 67 for the circuit provided as input to partitioning engine 69. A typical timing constraint references a pair of nodes in the circuit linked through one or more cells and indicates a maximum allowable signal path delay between the two nodes. Since the signal path delay between two nodes increases with the distance between the two nodes, it is helpful to place the two nodes close together. However when partitioning engine 69 divides the design into two or more partitions to be independently placed and routed, a signal path between two nodes can extend across partition boundaries when the two nodes are placed in separate partitions. Partitioning engine 69 must therefore create a timing budget 71 which allocates a portion of the timing constraint on each signal path to each partition that contains a portion of that signal path.

FIG. 13 illustrates an example wherein a signal path extends between a circuit node A within a partition 1 and a node B within a partition 2. If the maximum signal path delay between the two nodes A and B is constrained to T ns, then a first portion $T_A$ of the T ns must be allocated to the portion 130 of the signal path residing in partition 1, a second portion $T_B$ of the T ns must be allocated to the portion 131 of the signal path residing in partition 2, and a third portion $T_C$ of the T ns must allocated to the portion 132 of the signal path, if any, extending between partitions 1 and 2.

For each path for which there is a timing constraint, partitioning engine 69 checks the modified netlist to determine which cells are in the signal path to which the constraint applies. The cell library indicates the path delay through each cell, and partitioning engine 69 checks the cell library entry for each cell in the time-constrained signal path to determine the path delay for that cell. Partitioning engine 69 also employs a conventional "RC extraction" tool to determine the delay of routing paths described in the trial layout that interconnects the cells forming the time-constrained signal path.

Partitioning engine 69 next determines whether the constrained signal path cuts across partition boundaries. If so, partitioning engine 69 allocates a separate portion of the constraint to each partition though which the path extends. Since P&R tool 66 is not allowed enough time to ensure that the trial layout satisfies all constraints, the sum T' of the delays through the cells of the constrained path and through their interconnecting signal routing structures as described in the trial layout may be greater or smaller than time constraint T for that path. However the trial layout does provide a reasonable basis for allocating the timing constraint among partitions.

For example, when the calculated delay for path sections 130, 131 and 132 of FIG. 13 are $T'_A$, $T'_B$, and $T'_C$, respectively, based on the analysis of the trial placement, the total path delay for that path in the trial placement is T' ns, and the constraint for that path is T ns, then partitioning engine 69 calculates timing constraints $T_A$, $T_B$ and $T_C$ for path sections 130, 131 and 132, respectively, as follows:

$T_A=(T'_A/T)T$ $T_B=(T'_B/T)T$ $T_C=(T'_C/T)T.$

Since $T=T_A+T_B+T_C$, the timing constraint T for the entire signal path is fully distributed to the three path sections in proportion to their, calculated delays in the trial placement Partitioning engine 69 partitions all signal path timing constraints in a similar manner and produces timing budget 71 indicating results of the timing constraint allocations for each constrained signal path.

Partition Layouts

Conventional P&R and CTS tools 72 separately lay out each partition described in floor and pin assignment plan 70 in a manner that satisfies timing constraints included in timing budget 71. One P&R/CTS tool 72 may successively lay out each partition, or each of several P&R/CTS tools 72 running on separate computers could concurrently lay out separate partitions.

The floor and pin assignment plans 70 indicate which modules are included in each partition and indicates where signal paths are to cross partition boundaries. P&R and CTS tools 72 try to generate partition layouts that satisfy the all constraints. However when it can't find a placement and routing solution satisfying all of a partition's spatial and timing constraints, it produces a partition layout that comes as close as possible to satisfying the constraints. If simulation and verification tools 76 find a full-chip layout described by layout netlist 75 based on the combined partition layouts 73 meet all spatial and timing constraints, the layout process is complete. However if simulation and verification tools 76 determine that the combined IC layout produced by tools 72 fails to meet all constraints, partitioning engine 69 produces a new floor and pin assignment plan 70 and timing budget 71 based on the IC layout 68 produced by P&R and CTS tools 72 rather than on the trial layout produced by P&R tool 66. P&R and CTS tools 72 then produce new partition layouts 73 based on the new floor and pin assignment plans 70 and timing budget 71. The system repeats the process iteratively until it produces partition layouts 73 satisfying all constraints.

The allocations of spatial and timing constraints partitioning engine 69 initially placed on the partitions by floor plan 70 and timing budget 71 were estimates based on an analysis of the trial layout 68 produced by P&R tool 66. It is possible, for example, for partitioning engine 69 to allocate too little space to one partition and too much space to another, to err in establishing an appropriate shape for each partition, or to allocate too much of a path's timing constraint to portions of a path within one partition and not enough to portions of the path within another partition. When the IC layout produced by P&R and CTS tools 72 does not meet all spatial or timing constraints, the IC layout it does produce nonetheless provides a much better basis than the trail layout 68 for estimating the size and shape of the area each partition requires, and for estimating the signal path delays within each partition.

When engine 69 creates new floor and pin assignment plan 70 and timing budget 71 based on the IC layout produced by P&R and CTS tools 72, that layout more accurately reflects the actual spatial and timing requirements of each partition. The next partition layouts 73 produced by tools 72 are more likely to satisfy all constraints. When a layout satisfying all spatial and timing constraints is possible, the iterative planning and layout process will quickly converge to a satisfactory IC layout.

In cases where the system still cannot converge to an acceptable layout, it can be helpful for the designer to increase the number of cells clusterizing engine 64 includes in each cluster and to then restart the entire layout process. Although this increases the amount of time the system needs to generate a satisfactory layout, it gives P&R and CTS tools 72 more flexibility in cell placement, and that can help them to overcome problems they may have in satisfying the various timing or spatial constraints. Thus initially a designer may want to configure clusterizing engine 64 to keep the number of cells to be placed relatively small, thereby enabling the system to quickly produce an IC layout which may satisfy all constraints. However should system fail to produce a satisfactory layout, the designer can configure clusterizing engine to increase the allowable number of cells to be placed and restart the layout process.

As described above, the system makes use of the information included in database 62 regarding the hierarchical nature of the IC design in several ways. Clusterizing engine 64 uses that information to determine which cells or modules are siblings that ought to be combined to form a single cluster cell. Clusterizing engine 64 also uses the hierarchy information to determine which cells are included in each partition defined by partition specification 61, so that it can avoid clustering cells that are to reside in separate partitions. Clusterizing engine 64 also modifies database 62 to reflect the results of the clusterizing process.

Partitioning engine 69 makes use of the hierarchical information included in database 62 to determine which cells form the modules included in each partition defined by partition specification 61 so that it can determine the size, shape and position of the area of the trial layout 68 occupied by each module. This helps it to estimate the size, shape and position of the substrate area floor plan 70 is to reserve for each partition. P&R and CTS tools 72 access the hierarchical information in database 62 to determine which cells form the modules to be included in each partition.

The forgoing specification and the drawings depict an exemplary embodiment of the best mode of practicing the invention, and elements or steps of the depicted best mode exemplify the elements or steps of the invention as recited in the appended claims. However those of skill in the art will appreciate that other modes of practicing the invention are possible. Thus the appended claims are intended to apply to any mode of practicing the invention comprising the combination of elements or steps as described in any one of the claims, including elements or steps that are functional equivalents of the example elements or steps of the exemplary embodiment of the invention depicted in the specification and drawings.

We claim:

1. Computer readable media containing program instructions for a computer which when executed by the computer causes the computer to carry out a method for generating a layout for an integrated circuit (IC) described by a netlist as being formed by a hierarchy of cells grouped into modules, wherein each type of cell and module is described by a separate entry of a cell library, the method comprising the steps of:

a. compiling the netlist into a database having a separate record corresponding to each cell and each module, wherein each record indicates a hierarchical relationship between its corresponding cell or module and other cells or modules of the hierarchy, and wherein each record references a cell library entry describing its corresponding cell or module type;

b. processing the database to select groups of the cells according to their hierarchical relationships; and c. creating a separate new cell library entry corresponding to each selected group of cells, wherein each new cell library entry describes a cluster cell incorporating all cells of its corresponding group of cells.

2. The computer readable media in accordance with claim 1 wherein the method further comprises the step of:

d. processing the database to create a separate new record corresponding to each cluster cell, each now cluster cell record replacing the records corresponding to all cells incorporated into the cluster cell, referencing the new call library entry for that cluster cell, and indicating a hierarchical relationship between its corresponding cluster cells and other cells or modules of the hierarchy.

3. The computer readable media in accordance with claim 2 wherein the method further comprises the step of:

e. processing the database and the cell library to produce a first full-chip layout for the IC indicating trial positions within a semiconductor substrate for all cells and cluster cells corresponding to records of the database.

4. The computer readable media in accordance with claim 3 wherein the method further comprises the step of:

f. processing the first full-chip layout and the database to produce a first floor plan identifying a plurality of non-overlapping first partition areas of the semiconductor substrate, and indicating which modules corresponding to records of the database are assigned to each first partition area.

5. The computer readable media in accordance with claim 4 wherein the method further comprises the step of:

g. processing the database, the cell library and the first floor plan to independently generate a separate first partition layout for each said first partition area indicating where each cell forming a module assigned to that first partition area is to be placed relative that first partition area.

6. The computer readable media in accordance with claim 5 wherein the method further comprises the step of:

h. combining the partition layouts for all first partition areas to produce a second full-chip layout for the IC.

7. The computer readable media in accordance with claim 6 wherein the method further comprises the steps of:

i. processing the first full-chip layout and the database to produce a second floor plan identifying a plurality of second non-overlapping partition areas of the semiconductor substrate, and indicating which modules corresponding to records of the database are assigned to each second partition area; and j. processing the database, the cell library and the second floor plan to independently generate a separate second partition layout for each said second partition area indicating where each cell forming a module assigned to the second partition area is to be placed within that second partition area, and k. combining all second partition layouts to produce a third full-chip layout for the IC.

8. The computer readable media in accordance with claim 3 wherein the database and cell library are processed at step a in a manner that is biased toward placing cells that are highly interconnected with one another near one another in the first full-chip layout.

9. The computer readable media in accordance with claim 4 wherein the database and cell library are processed at step e in a manner that is biased toward placing cells that are highly interconnected with one another near one another in the first full-chip layout, and wherein step f comprises the substeps of:

f1. for each first partition area, identifying a module area of the semiconductor substrate within which the first full-chip layout positioned all cells forming each module assigned to that first partition area, f2. selecting a size, shape and position within the semiconductor area of each first partition area based on a size, shape and position of all identified module areas containing all cells of each module assigned to that first partition area, and f3. producing the first floor plan identifying the selected size, shape and position of each said first partition area.

10. The computer readable media in accordance with claim 9 wherein the method further comprises the steps of:

g. processing the database, the cell library and the first floor plan to independently generate a separate first partition layout for each said first partition area indicating where each cell forming a module assigned to that first partition area is to be placed relative that first partition area, and h. combining the partition layouts for all first partition areas to produce a second full-chip layout for the IC.

11. The computer readable media in accordance with claim 1 wherein each module of the hierarchy is formed by at least one other module or cell of the hierarchy and is therefore a parent of said at least one module or cell, each of said at least one module or cell being therefore a child of its parent and a sibling of all other children of a same parent, and wherein each record of the database indicates a hierarchical relationship between its corresponding cell or module by including fields for referencing the parent of its corresponding cell or module, at least one sibling of its corresponding cell or module, and at least one child of its corresponding cell or module.

12. The computer readable media in accordance with claim 11 wherein step b comprises the substeps of:

b1. processing the database to identify modules formed by a number of cells residing within a predetermined range, b2. processing the database to select said groups of cells from among the identified modules.

13. A method for generating a layout for an integrated circuit (IC) described by a netlist as being formed by a hierarchy of cells grouped into modules, wherein each type of cell and module is described by a separate entry of a cell library, the method comprising the steps of:

a. compiling the netlist into a database having a separate record corresponding to each cell and each module, wherein each record indicates a hierarchical relationship between its corresponding cell or module and other cells or modules of the hierarchy, and wherein each record references a cell library entry describing its corresponding cell or module type;

b. processing the database to select groups of the cells according to their hierarchical relationships; and c. creating a separate new cell library entry corresponding to each selected group of cells, wherein each new cell library entry describes a cluster cell incorporating all cells of its corresponding group of cells.

14. The method in accordance with claim 13 further comprising the step of:

d. processing the database to create a separate new record corresponding to each cluster cell, each new cluster cell record replacing the records corresponding to all cells incorporated into the cluster cell, referencing the new cell library entry for that cluster cell, and indicating a hierarchical relationship between its corresponding cluster cells and other cells or modules of Lie hierarchy.

15. The method in accordance with claim 14 further comprising the step of:

e. processing the database and the cell library to produce a first full-chip layout for the IC indicating trial positions within a semiconductor substrate for all cells and cluster cells corresponding to records of the database.

16. The method in accordance with claim 15 further comprising the step of:

f. processing the first full-chip layout and the database to produce a first floor plan identifying a plurality of non-overlapping first partition areas of the semiconductor substrate, and indicating which modules corresponding to records of the database are assigned to each first partition area.

17. The method in accordance with claim 16 further comprising the step of:

g. processing the database, the cell library and the first floor plan to independently generate a separate first partition layout for each said first partition area indicating where each cell forming a module assigned to that first partition area is to be placed relative that first partition area.

18. The method in accordance with claim 17 further comprising the step of:

h. combining the partition layouts for all first partition areas to produce a second full-chip layout for the IC.

19. The method in accordance with claim 18 further comprising the steps of:

i. processing the first full chip layout and the database to produce a second floor plan identifying a plurality of second non-overlapping partition areas of the semiconductor substrate, and indicating which modules corresponding to records of the database are assigned to each second partition area; and j. processing the database, the cell library and the second floor plan to independently generate a separate second partition layout for each said second partition area indicating where each cell forming a module assigned to the second partition area is to be placed within that second partition area, and k. combining all second partition layouts to produce a third full-chip layout for the IC.

20. The method in accordance with claim 15 wherein the database and cell library are processed at step e in a manner that is biased toward placing cells that are highly interconnected with one another near one another in the first full-chip layout.

21. The method in accordance with claim 16 wherein the database and cell library are processed at step e in a manner that is biased toward placing cells that are highly interconnected with one another near one another in the first full-chip layout, and wherein step f comprises the substeps of:

f1. for each first partition area, identifying a module area of the semiconductor substrate within which the first full-chip layout positioned all cells forming each module assigned to that first partition area;

f2. selecting a size, shape and position within the semiconductor area of each first partition area based on a size, shape and position of all identified module areas containing all cells of each module assigned to that first partition area; and f3. producing the first floor plan identifying the selected size, shape and position of each said first partition area.

22. The method in accordance with claim 21 further comprising the steps of:

g. processing the database, the cell library and the first floor plan to independently generate a separate first partition layout for each said first partition area indicating where each cell forming a module assigned to that first partition area is to be placed relative that first partition area, and h. combining the partition layouts for all first partition areas to produce a second full-chip layout for the IC.

23. The method in accordance with claim 13 wherein each module of the hierarchy is formed by at least one other module or cell of the hierarchy and is therefore a parent of said at least one module or cell, each of said at least one module or cell being therefore a child of its parent and a sibling of all other children of a same parent, and wherein each record of the database indicates a hierarchical relationship between its corresponding cell or module by including fields for referencing the parent of its corresponding cell or module, at least one sibling of its corresponding cell or module, and at least one child of its corresponding cell or module.

24. The method in accordance with claim 23 wherein step b comprises the substeps of:

b1. processing the database to identify modules formed by a number of cells residing within a predetermined range, b2. processing the database to select said groups of cells from among the identified modules.

25. A method generating an IC layout of an IC design described by a hierarchical netlist as including cells forming a hierarchy of modules, wherein a partition specification allocates the modules among a plurality of design partitions, the method comprising the steps of:

a. compiling the netlist into a database having a separate record corresponding to each cell and each module of the IC design, wherein each database record references an entry of the cell library describing the cell or module and indicates hierarchical relationships between its corresponding cell or module and other cells or modules of the design;

b. processing the database to reduce a number of cell and module records included in the database by combining groups of hierarchically related cells and modules into cluster cells and replacing database records corresponding to the groups of cells with records corresponding to the cluster cells;

c. processing the database and cell library to generate a trial layout of the IC described by the database in a manner biased toward positioning highly interconnected cells near one another without regard to hierarchical relationships between cells and modules;

d. developing a floor plan allocating a separate area of a semiconductor substrate to each design partition in accordance with an estimate of a size, shape and position of substrate area needed for modules allocated to each design partition based on actual areas in the trial layout occupied by cells forming the modules allocated to each design partition;

e. processing the database and the cell library to separately design a layout for each partition in its allocated area of semiconductor substrate; and f. combining the layouts for all partitions to form the IC layout.

* * * * *

UNITED STATES PATENT AND TRADEMARK OFFICE
CERTIFICATE OF CORRECTION

PATENT NO. : 6,865,726 B1
DATED : March 8, 2005
INVENTOR(S) : Mitsuru Igusa and Wei-Lun Kao It is certified that error appears in the above-identified patent and that said Letters Patent is hereby corrected as shown below:

Column 18,
Lines 32 and 33, "step a" should be deleted and replaced with -- step e --.

Signed and Sealed this

Twenty-fourth Day of May, 2005

JON W. DUDAS
*Director of the United States Patent and Trademark Office*